United States Patent [19]

Reese et al.

[11] 4,453,237
[45] Jun. 5, 1984

[54] MULTIPLE BIT OUTPUT DYNAMIC RANDOM-ACCESS MEMORY

[75] Inventors: Edmund A. Reese, Portland; Dieter W. Spaderna; Stephen T. Flannagan, both of Beaverton, all of Oreg.

[73] Assignee: Intel Corporation, Santa Clara, Calif.

[21] Appl. No.: 483,772

[22] Filed: Apr. 11, 1983

Related U.S. Application Data

[62] Division of Ser. No. 192,740, Oct. 1, 1980, Pat. No. 4,406,013.

[51] Int. Cl.³ .............................................. G11C 11/40
[52] U.S. Cl. ............................................... 365/222
[58] Field of Search .............. 365/203, 211, 212, 222, 365/230

[56] References Cited

U.S. PATENT DOCUMENTS

| | | | |
|---|---|---|---|
| 3,705,392 | 12/1972 | Appelt | 365/222 |
| 3,851,316 | 11/1974 | Kodama | 365/212 |
| 4,322,825 | 3/1982 | Nagami | 365/203 |
| 4,357,686 | 11/1982 | Schewneman | 365/222 |

Primary Examiner—Joseph A. Popek
Attorney, Agent, or Firm—Blakely, Sokoloff, Taylor & Zafman

[57] ABSTRACT

A dynamic MOS random-access memory is described which includes a circuit for permitting checking of the on chip refresh counter. The memory also includes a refresh generator, the frequency of which automatically varies to compensate for temperature variations. Other innovations include an arbitration circuit, a hidden refresh function and unique accessing of redundant lines.

4 Claims, 9 Drawing Figures

REFRESH TIMER

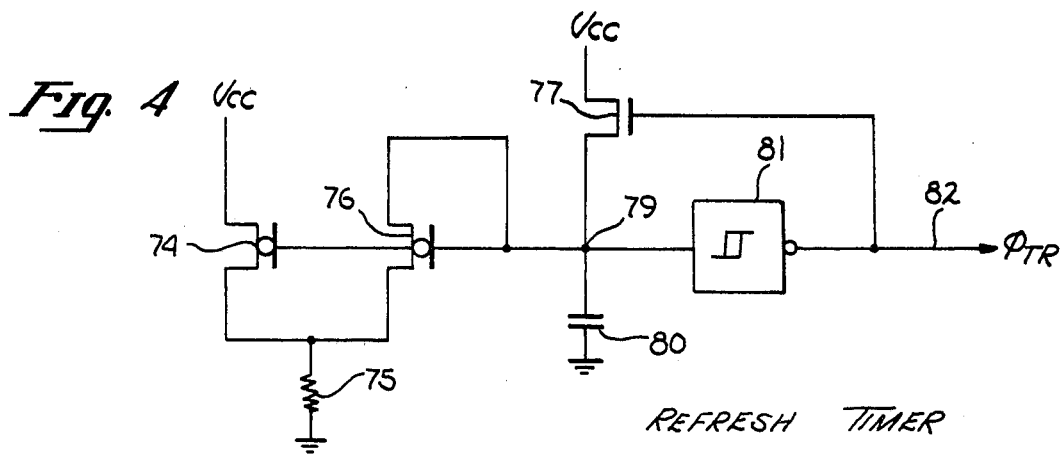
Fig. 4 REFRESH TIMER
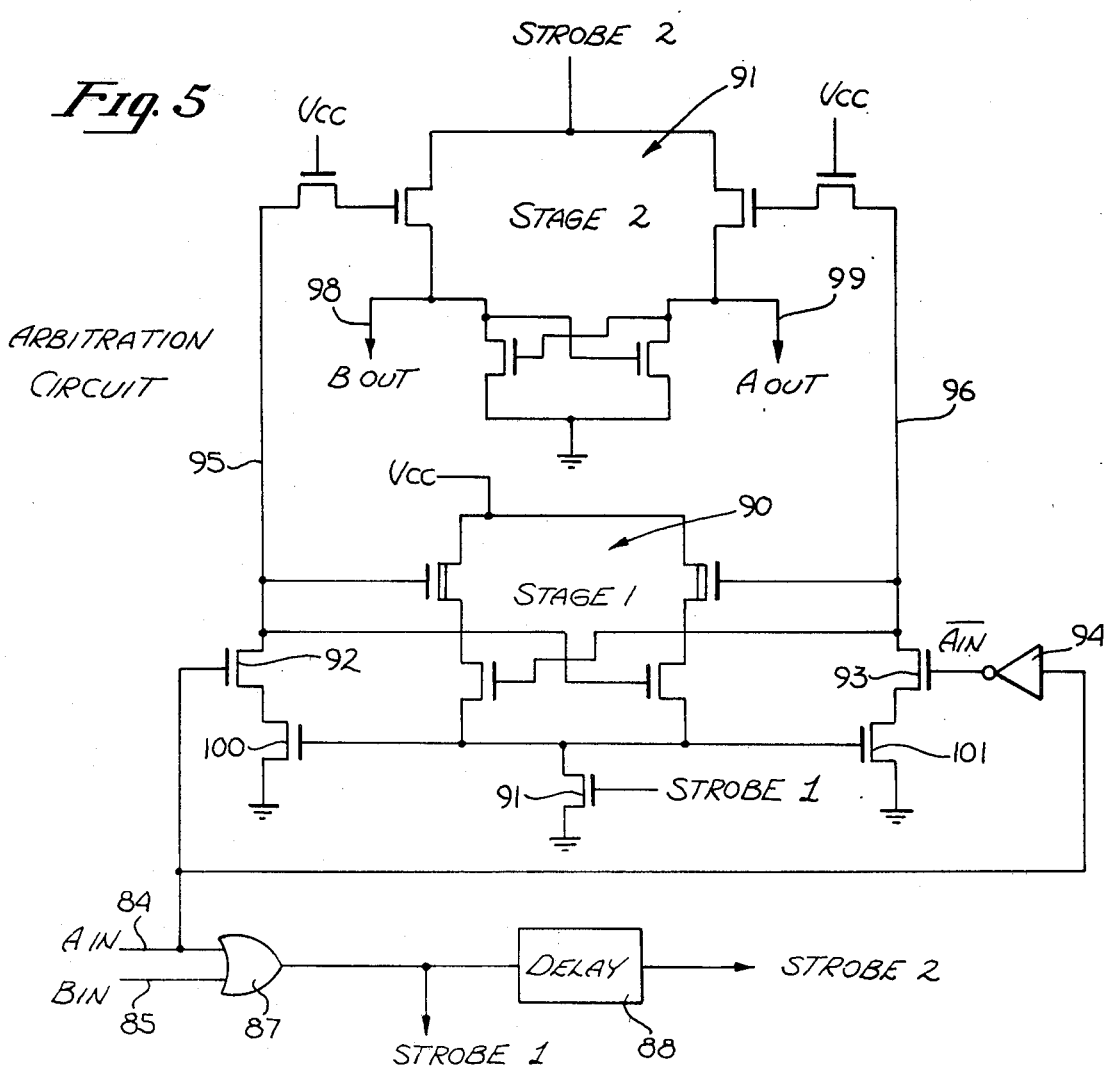
Fig. 5 ARBITRATION CIRCUIT

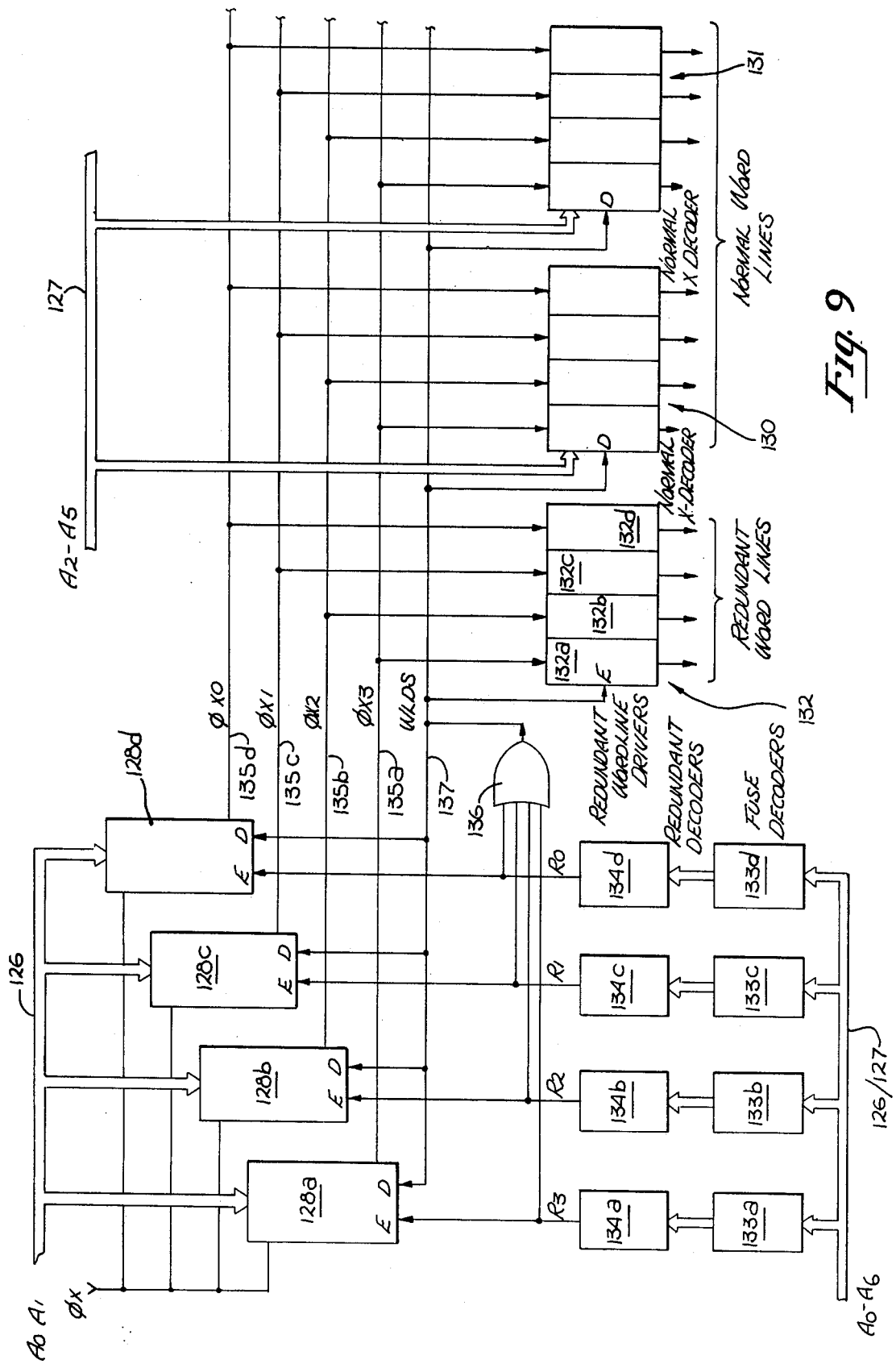

MULTIPLE BIT OUTPUT DYNAMIC RANDOM-ACCESS MEMORY

This is a divisional of application Ser. No. 192,740 filed Oct. 1, 1980, now U.S. Pat. No. 4,406,013.

BACKGROUND OF THE INVENTION

1. Field of the Invention

The invention relates to the field of dynamic random-access memories, particularly metal-oxide-semiconductor memories.

2. Prior Art

Dynamic random-access memories (RAMs), particularly those fabricated with metal-oxide-semiconductor (MOS) technology are widely used in the electronics industry. In the past, many of the control functions associated with these dynamic memories, such as for refreshing, have been performed by circuitry external to the memory "chips". More recently, particularly for memory applications with microcomputers, more of these control functions are performed by the memory. This requires, for example, an on-chip refresh timing generator, arbitration circuitry to handle conflicts between external access requests and on-chip refresh requests, in addition to other circuitry.

The closest prior art RAMs known to the Applicant are described in U.S. Pat. Nos.: 4,038,646 and 3,978,459; and 4,247,917 filed Aug. 8, 1979 and assigned to the assignee of the present invention.

To improve fabrication yields for memories, redundant rows and/or columns, including related address decoders, are fabricated on the chip or substrate. These redundant circuits, of course, are used to replace faulty circuits within the memory array. An example of one prior art redundancy scheme is disclosed in U.S. Pat. No. 4,250,570 filed Jan. 9, 1978 and assigned to the assignee of the present invention. As will be seen, the presently described RAM includes redundant circuits which are accessed in a unique manner.

SUMMARY OF THE INVENTION

An improvement for a dynamic random-access memory which includes memory cells coupled to sense amplifiers by bit lines is described. The memory includes a digital counter for selecting cells in the array for refreshing; one improvement of the present invention is a means for checking this counter. For this improvement the memory includes writing means for writing binary zeros into predetermined cells and charging means for charging the bit lines interconnecting these cells with the sense amplifiers. Disabling means coupled to the sense amplifiers prevent the sensing (by the amplifiers) of the binary data stored in the cells. Rather, as the cells are accessed by the counter, charge from the bit lines changes the data stored in the cells from binary zeros to binary ones. Then, through reading means, the cells are read to verify that they all contain binary ones. If they do, it can be assumed that the counter is working properly and that all the cells have been accessed. On the other hand, if some of the cells still contain binary zeros, it can be assumed that the counter (or other circuitry) has failed.

Other unique aspects of the described memory include a refresh generator, the frequency of which automatically changes with the memory temperature. More refreshing occurs at higher temperatures to compensate for the higher leakage in the capacitive storage cells. Since the signals from the refresh generator are asynchronous with memory access signals, simultaneous occurrence of these signals is possible, causing a "lock-up". The memory includes a unique arbitration circuit for preventing this condition. Also, the refreshing of the memory cells, when possible is performed so as to hide the refresh cycle from the user. This "smart" refreshing substantially reduced the handling of "ready" signals, or like signals, between the memory, and for example, a microcomputer.

BRIEF DESCRIPTION OF THE DRAWINGS

FIG. 4 is an electrical schematic of the refresh timer or generator used in the invented memory.

FIG. 5 is an electrical schematic of the arbitration circuit used in the invented memory.

FIG. 9 is a block diagram illustrating the manner in which redundant word lines in the memory array are selected.

DETAILED DESCRIPTION OF THE INVENTION

Figure 1:
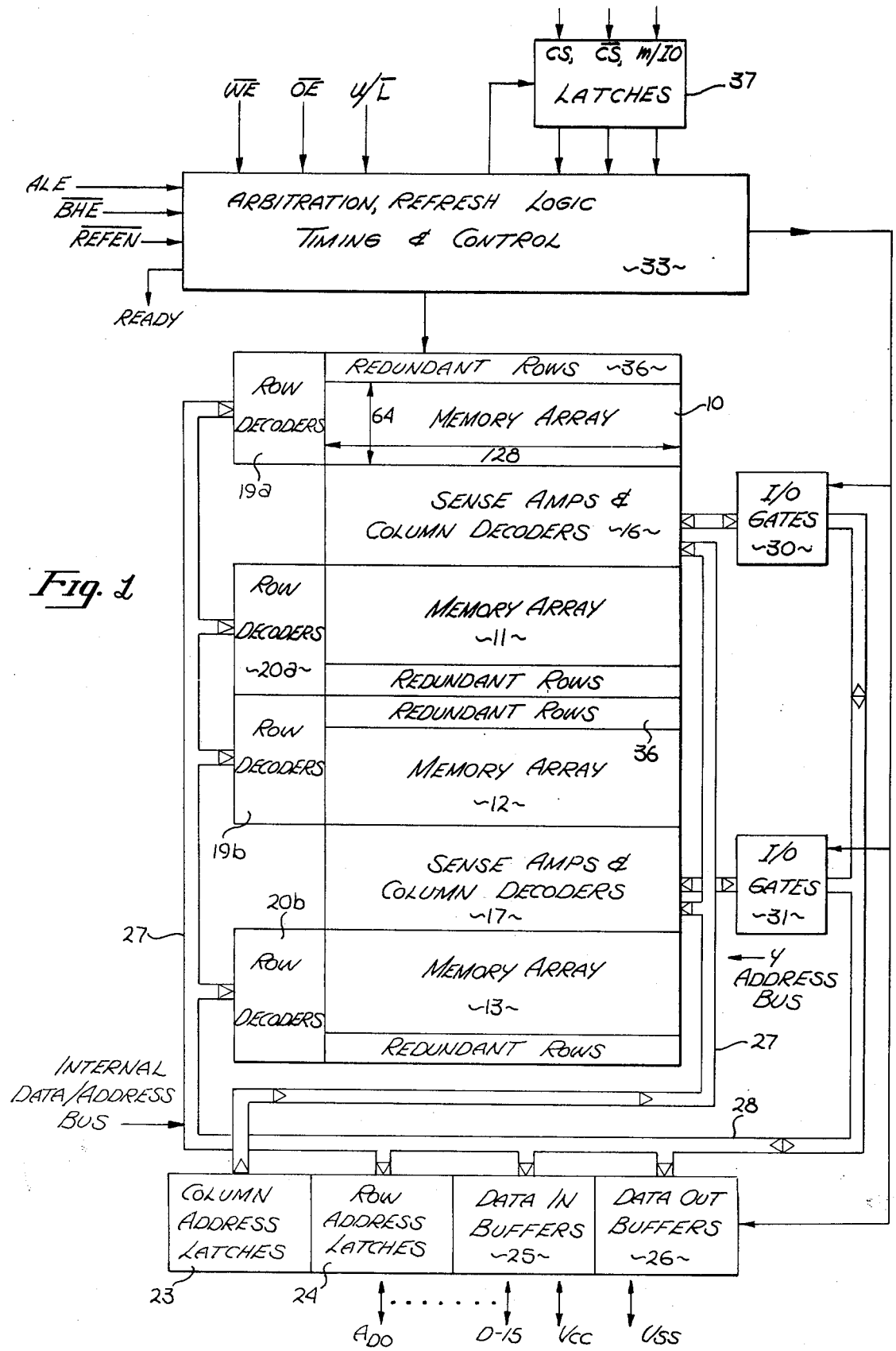
FIG. 1 is a block diagram illustrating the general layout of the invented memory.

A random-access memory (RAM) fabricated with metal-oxide-semiconductor (MOS) technology is described. In the following disclosure, numerous specific details such as specific thresholds, numbers of lines, etc. are set forth to provide a thorough understanding of the present invention. However, it will be obvious to one skilled in the art that the inventive concepts described below may be practiced without these specific details. In other instances, well-known circuits and fabrication techniques have not been described in detail in order not to obscure the present invention in unnecessary detail.

General Layout of Memory

In its presently preferred embodiment, the described memory is realized as a 4K×8 array, disposed on a silicon substrate with all peripheral circuits such as buffers, decoders, etc. The memory is fabricated with n-channel MOS field-effect transistors employing double layers of polycrystalline silicon. A single power supply of +5 volts is used, with on-chip generation of a substrate biasing potential of approximately −3 volts. The memory consumes approximately 250 milliwatts when active and 50 milliwatts in stand-by modes. Typical access time is 200 ns, making the memory compatible with the 8 MHz clock rate of commercial microprocessors such as the Intel 8086.

Three different MOS transistor types are used in the described memory. The first is an enhancement mode transistor having a threshold voltage of approximately 0.8 volts. This transistor is shown in the drawings with the standard field-effect transistor symbol, such as transistor 50 of FIG. 2. A second transistor type is a depletion mode transistor having a threshold voltage of approximately −2.5 volts. This transistor type is shown, by way of example, as transistor 51 of FIG. 2. The third transistor type is a "zero threshold transistor" having a threshold voltage close to 0 volts. The transistor is shown in the drawings with a "zero" under the gate such as transistor 60 of FIG. 2.

As presently implemented, the invented memory has multiplexed data and address ports. (The memory also uses an internal (on-chip) multiplexed data and address bus.) The multiplexed data and address ports makes the memory compatible with commercially available microcomputers and support circuitry such as are available for Intel's 8086 microcomputer.

The package "pin-out" configuration used for the described memory is as follows:

| PIN | SIGNAL |
|-----|--------|
| 1 | Ready |
| 2 | $\overline{\text{REFEN}}$ (Refresh Enable/Self Refresh) |
| 3 | U/L (upper/lower byte) |
| 4 | AD0 (address/data) |
| 5 | AD1 |
| 6 | AD2 |
| 7 | AD3 |
| 8 | AD4 |
| 9 | AD5 |
| 10 | AD6 |
| 11 | AD7 |
| 12 | AD8 |
| 13 | AD9 |
| 14 | $V_{SS}$ (ground) |
| 15 | AD10 |
| 16 | AD11 |
| 17 | AD12 |
| 18 | D13 (data) |
| 19 | D14 |
| 20 | D15 |
| 21 | ALE (address latch enable) |
| 22 | $\overline{\text{WE}}$ (write enable) |
| 23 | $\overline{\text{OE}}$ (output enable) |
| 24 | $\overline{\text{CS}}$ (chip select) |
| 25 | CS (chip select) |
| 26 | M/IO (memory or I/O access control input) |
| 27 | $\overline{\text{BHE}}$/8-16 (bus high enable input with A0 or 8-16 depending on U/L) |
| 28 | $V_{CC}$ (5 volts) |

When pairs of the described memory are used with a 16-bit bus pin (4) (AD0) becomes the chip WRITE select pin for one of the paired memories.

Referring now to FIG. 1, in the general layout of the memory, the memory cells are grouped into four arrays, arrays 10, 11, 12 and 13. Each array has 64 rows and 128 columns. The bit lines from the arrays 10 and 11 are coupled to the sense amplifiers and column decoders 16; the bit lines from the arrays 12 and 13 are likewise coupled to the sense amplifiers and column decoders 17. The row decoders 19a and 19b are identical and similarly, the row decoders 20a and 20b are identical. For each row address, a row in arrays 10 and 12, or arrays 11 and 13, are selected. For each column address, four columns (bit lines) are selected in arrays 10 and 12, or arrays 11 and 13. Thus, for each unique address of 12 bits, 8 memory cells from the arrays are selected and the data is coupled 4 bits through gates 30 and 4-bits through gates 31 onto or from the internal data/address bus 28.

Each of the arrays, 10, 11, 12 and 13, includes two redundant rows 36. These are decoders associated with each of these rows and other circuitry which disables the inoperative rows as will be described in conjunction with FIG. 9.

The internal data/address bus 28, in addition to being coupled to the gates 30 and 31, is coupled to the data-out buffers 26, the data-in buffers 25 and the row address latches 24. This bus also couples the address signals $A_0$–$A_5$ (and $A_{12}$ if $A_0$ is not used for an address) to the row decoders. The column address latches 23 are coupled through the bus 27 to the column decoders 16 and 17. The other control signals associated with the memory are coupled either to the arbitration, refresh logic, timing and control means 33 or to the latches 37.

Refresh Counter Testing

Figure 2:
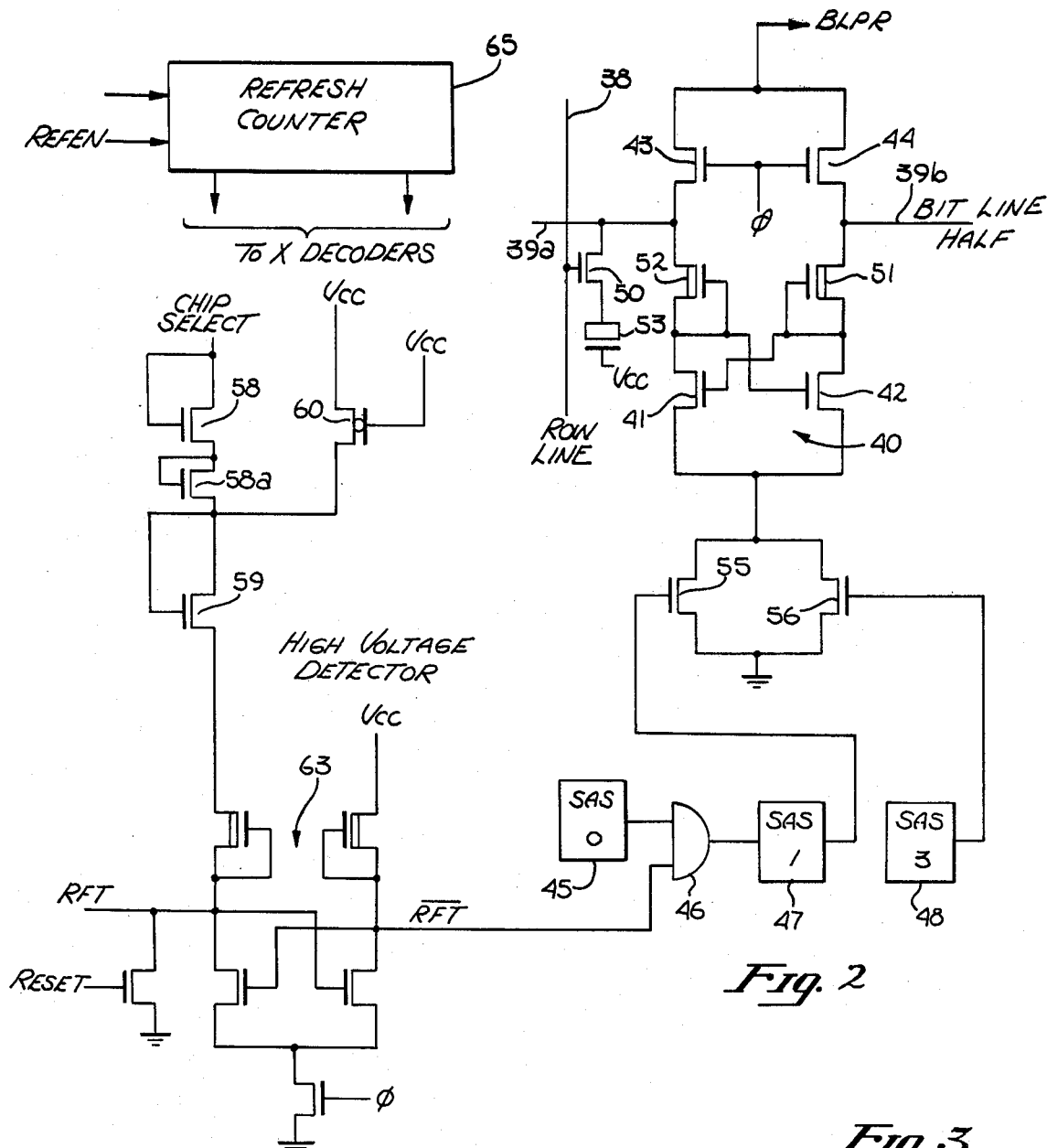
FIG. 2 is an electrical schematic showing a typical sense amplifier, memory cell and associated bit and word lines and the novel circuitry used in the present invention for checking the operation of the refresh counter.

Referring now to FIG. 2, in the right hand portion of the figure, one of the plurality of sense amplifiers used in the memory and a memory cell are illustrated. The sense amplifier 40 is connected to the bit line halves 39a and 39b. A cell comprising the transistor 50 and capacitor 53 is coupled to line 39a, with the gate of transistor 50 coupled to the row line 38.

The sense amplifier 40 is of somewhat ordinary construction and includes a pair of cross-coupled transistors 41 and 42. These transistors are coupled to the bit line halves through the depletion mode transistors 52 and 51, respectively. Transistors 43 and 44 are used for precharging the bit line halves. These transistors are coupled to receive the bit line pre-charged signal (BLPR). The source terminals of transistors 41 and 42 are coupled to ground through the parallel combination of transistors 55 and 56.

As is known in the prior art, sense amplifiers, such as amplifier 40, are turned-on through one or more sense amplifier strobe signals. These signals are generated through the strobe signal generators 45, 47 and 48. For purposes of the present invention, an AND gate 46 interconnects the generators 45 and 47. One input of gate 46 is the complement of the refresh test signal ($\overline{\text{RFT}}$). As is apparent, when the $\overline{\text{RFT}}$ signal is low, the signal from generator 45 is prevented from being coupled to generator 47, and in turn, no signal passes from generator 47 to generator 48. Thus, when $\overline{\text{RFT}}$ is low, transistors 55 and 56 are prevented from conducting and the sense amplifier 40 is prevented from sensing the data on the bit line 39.

During refreshing, the refresh counter 65 selects rows in the array through the X-decoders for refreshing. On each successive refresh cycle, a different row is refreshed and the count in counter 65 is then incremented. It is difficult to test a counter such as the counter 65 when the counter is incorporated into a memory. However, with the circuit of FIG. 2, the counter 65 may be more readily checked.

The bistable circuit 63 is used to initiate testing of the counter 65. The transistors 58,58a, 59 and 60 act as a high voltage detector. When a high voltage (e.g. 12 volts) is applied to transistor 58, this voltage causes the bistable circuit 63 to be set such that RFT is high and $\overline{\text{RFT}}$ is low. Otherwise, RFT is low and $\overline{\text{RFT}}$ high. In the presently preferred embodiment, the chip select pin is coupled to transistor 58 and testing is initiated by applying the high voltage to this pin.

Figure 3:
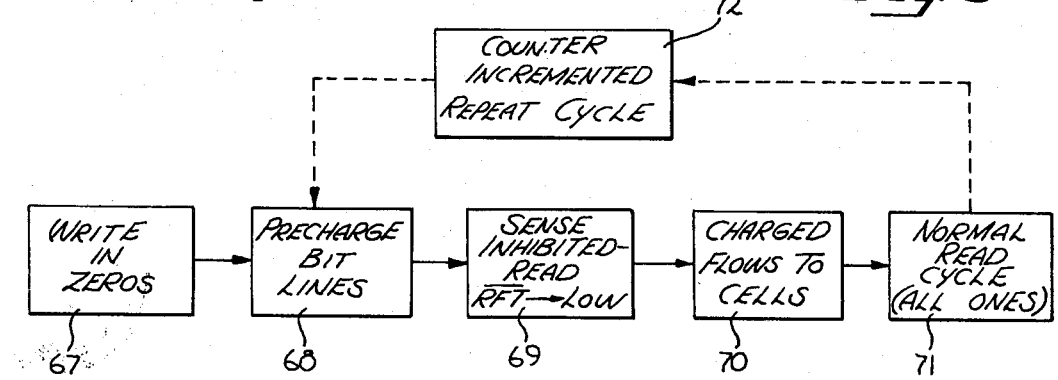
FIG. 3 is a series of blocks used to explain the operation of the circuit of FIG. 2.

The blocks of FIG. 3 illustrate the manner in which this testing proceeds. First, all zeros are written into the array (that is, electrons are stored on the capacitors, such as capacitor 53). This is illustrated by block 67. Now, for each possible count of counter 65, a test cycle is initiated which consists of an ordinary read cycle with inhibited sensing. This is done by charging the bit lines (in the positive sense) as indicated by block 68. Then, the counter 65 selects a word line through the X-decoders, such as line 38. When transistor 50 (and like transistors) conduct, the charge on line 39a flows onto capacitor 53, changing the binary zero stored on this capacitor to a binary one. (Note the capacitance of line 39a is substantially greater than the capacitance of capacitor 53). Importantly, when this occurs, the $\overline{RFT}$ signal is low, preventing transistors 55 and 56 from conducting. This prevents sensing of the binary zero stored on capacitor 53 and effectively allows the charge to be transferred from the bit line half to the capacitor. The flow of charge onto capacitor 53 is illustrated by block 70.

Next, an ordinary read cycle is initiated. This read cycle should indicate that the capacitors selected by counter 65 now contain binary-ones. If they do not, it will be apparent that the counter 65 has not properly selected the row lines.

As indicated by block 72, the counter is incremented through each of its possible states by the refresh enable signal and the cycle is repeated until the counter has been fully exercised. Each time the counter is incremented, the output of the memory is checked to determine if binary-ones are present on the rows selected. In this manner, the operation of the refresh counter and associate circuits are readily checked.

Refresh Timer

Referring now to FIG. 4, the refresh timer or generator illustrated in this figure provides a signal ($\phi_{TR}$) on line 82 which controls the frequency of refreshing for the self-refreshing mode. This line is coupled to the output of an inverting Schmitt trigger 81 and also is coupled to the gate of the enhancement mode transistor 77. The source terminal of this transistor (node 79) is coupled to the input of the Schmitt trigger 81, capacitor 80, the gates of transistors 74 and 76 and the drain terminal of transistor 76. The drain terminals of transistors 74 and 77 are coupled to $V_{cc}$. The source terminals of transistors 74 and 76 are coupled to ground through a resistor 75.

The transistors 74 and 76 have a slightly positive threshold voltage. This slightly positive threshold voltage is assured by making the channels longer for the transistors 74 and 76. The resistor 75 is a second level polysilicon region having a resistance of approximately 10k ohms. The capacitor 80 is an ordinary MOS capacitor which is fabricated from the second layer of polycrystalline silicon and an intermediate oxide layer and the silicon substrate. The capacitance of this capacitor in the presently preferred embodiment, is approximately 12 pf. The gate-to-source terminals of transistors 74 and 76 are at the same potential and these devices are always in saturation. (The current through these devices is determined almost solely by their geometry.) These transistors effectively multiply the resistance of resistor 75 as measured from node 79 (or as seen by capacitor 80).

When node 79 is low (capacitor 80 discharged) the output of the Schmitt trigger 81 (line 82) is high. This causes transistor 77 to conduct and quickly charges capacitor 80. Once the potential on node 79 reaches the threshold level of the Schmitt trigger 81, the potential on line 82 drops and transistor 77 ceases to conduct. The charge on capacitor 80 drains through transistor 76 and resistor 75. As mentioned, when the effective resistance of resistor 75 is multiplied, it causes the charge to slowly drain. For the described generator, the nominal frequency of oscillation is approximately 100 KHz. To achieve this lower frequency with an ordinary RC time constant, the capacitor 80, for instance, would have to be approximately 30 times the size actually used.

As the temperature of the memory increases, leakage also increases and the memory cells require more frequent refreshing. The increased temperature causes resistor 75 to have a lower resistance since the highly doped silicon becomes more conductive with increased temperature. (The resistor 75 has a positive temperature coefficient as opposed to, for example, a carbon resistor which has a negative temperature coefficient.) As temperature rises, and the resistance of resistor 75 decreases, capacitor 80 is discharged more quickly and the frequency of oscillations increase. This causes the cells to be refreshed more frequently at higher temperatures which is the desired result. On the other hand, as the temperature decreases the resistance of resistor 75 increases, and the output frequency likewise decreases.

Thus, the generator of FIG. 4 provides automatic compensation for variations in temperatures by adjusting the output frequency of the generator. The transistors 74 and 76 permit the generation of the required lower output frequencies with a minimum utilization of substrate area by effectively multiplying the resistance of resistor 75.

While in FIG. 4 the resistor 75 is shown coupled to the source terminals of transistors 74 and 76 the same result can be achieved if the resistor 75 is coupled between $V_{CC}$ and the drain terminal of transistor 74.

Arbitration Circuit

Referring now to FIG. 5, the arbitration circuit shown therein provides arbitration between two signals which are asynchronous, and thus, which may occur simultaneously. Specifically, a problem can occur if there is a simultaneous request for refresh (from the on-chip timer) and a request, for example, for access to data in the memory. More specifically, in the presently preferred embodiment, the arbitration circuit of FIG. 5 arbitrates between the $\phi_{TR}$ signal (FIG. 4) and the address latch enable signal (ALE). The signal from line 82 of FIG. 4, after passing through latch, is coupled to line 84 and is shown as $A_{IN}$ in FIG. 5. Similarly, the ALE signal after passing through a gate and latch, is coupled to line 85 of FIG. 5 and is shown as $B_{IN}$.

The circuit of FIG. 5 includes a first stage 90 and a second stage 91; both stages include a bistable (flip-flop) circuit. The $A_{OUT}$ (line 99) and the $B_{OUT}$ (line 98) signals are determined by the state of the bistable circuit of stage 91 at the time the strobe 2 signal occurs.

Both the $A_{IN}$ and $B_{IN}$ inputs are coupled to an OR gate 87. The output of this OR gate provides a strobe signal (strobe 1) which is coupled to transistor 91. This signal is delayed by a delay means 88 and provides a second strobe signal which is used to power the stage 91. In the presently preferred embodiment, the delay provided by delay means 88 is approximately 20–25 nsec. The $A_{IN}$ signal (line 84) provides one input to the bistable circuit of stage 90. This signal is coupled to the gate of transistor 92; the source terminal of transistor 92 is coupled to ground through transistor 100. The other input to stage 90 is generated by the inverter 94 which receives the $A_{IN}$ signal. The $\overline{A_{IN}}$ signal is coupled to the gate of transistor 93; the source terminal of this transistor is coupled to ground through transistor 101. As is apparent from stage 90, when the strobe 1 signal occurs, transistor 91 conducts, allowing the bistable circuit of stage 90 to assume one of its two stable states. Simultaneously, with this conduction, transistors 100 and 101 are cut-off.

The problem that can occur is that $A_{IN}$ can be changing state at the time the strobe 1 signal occurs. As $A_{IN} - \overline{A_{IN}}$ becomes smaller, a longer and longer time is required for stage 90 to assume one of its two stable states. And in theory, if $A_{IN} - \overline{A_{IN}}$ is equal to zero, stage 90 will not assume a stable state and a "failure" will occur. For a general discussion of this problem, see "The Behavior of Flip-Flops Used as Synchronizers and Prediction of their Failure Rate", *IEEE Journal of Solid-State Circuits*, Vol. SC-15, No. 2, April 1980, beginning on page 169 by Veendrick.

The bistable circuit of stage 90 operates as a transparent latch. The outputs of this circuit are driven by $A_{IN}$ and $\overline{A_{IN}}$ until the strobe 1 signal occurs. Upon the occurrence of the strobe 1 signal, this circuit is isolated from the $A_{IN}$ and $\overline{A_{IN}}$ inputs since transistors 100 and 101 cease conducting. The bistable circuit remains in whatever state it was in before the strobe signal occurred. It is this isolation which prevents the bistable circuit from being "hung-up".

Either the $A_{IN}$ or $B_{IN}$ signals may trigger a strobe 1 signal through the OR gate 87. Since the $A_{IN}$ signal is also the input to stage 90, and further, since there is some delay in generating the strobe 1 signal, stage 90 will be set in favor of the $A_{IN}$ signal. On the other hand, if $B_{IN}$ triggers the strobe 1 signal, the bistable circuit will be set for $\overline{A_{IN}}$.

The arbitration occurs when $A_{IN}$ and $B_{IN}$ occur approximately simultaneously. Then the strobe signal will occur while the $A_{IN}\overline{A_{IN}}$ inputs to the circuit 90 are changing. The outcome of this case is unprecitable and the bistable circuit may be left in an unstable state with both outputs high. In this case, the strobe 1 signal removes all external drives since transistors 100 and 101 are cut-off. This allows the bistable circuit to settle in one, or the other, of its stable states as quickly as possible. After a delay, (delay means 88) strobe 2 is generated to drive the bistable circuit of stage 91 to its stable state. In this manner, the second stage 91 will make an unambiguous decision between $A_{OUT}$ or $B_{OUT}$. It has been found that with a gain-bandwidth product for stage 90 of approximately $1.3 \times 10^9$ and a delay time of 20-25 nsec., that the probability of failure for the stage 90 is very limited (a failure predicted in terms of decades).

Hidden Refresh

During the self refresh mode (as determined by the signal on pin 2) refreshing is controlled on-chip. The memory provides for "hidden refreshes" by refreshing ahead of time, that is, before a mandatory refresh, when the memory is not being accessed. Then the memory is able to ignore the next internal refresh signal ($\phi_{TR}$). This prevents a possible conflict between the $\phi_{TR}$ signal and an external chip select signal. This operation is shown in a flow diagram form in FIG. 7. As indicated by block 122, on the falling edge of the address latch enable (ALE) signal, if the chip select (CS) signal is low, a refresh will occur. During this refresh, the "ready" signal remains high. Now, as indicated by block 123, once a hidden refresh occurs, the next $\phi_{TR}$ signal is ignored. The $\phi_{TR}$ signal, however, permits another hidden refresh to occur. Of course, if a hidden refresh has not occurred, the $\phi_{TR}$ signal will cause an immediate refresh. However, if there is conflicting signals, that is, if the $\phi_{TR}$ signal is high along with the ALE signal, arbitration may be necessary as indicated by block 124.

Figure 6:
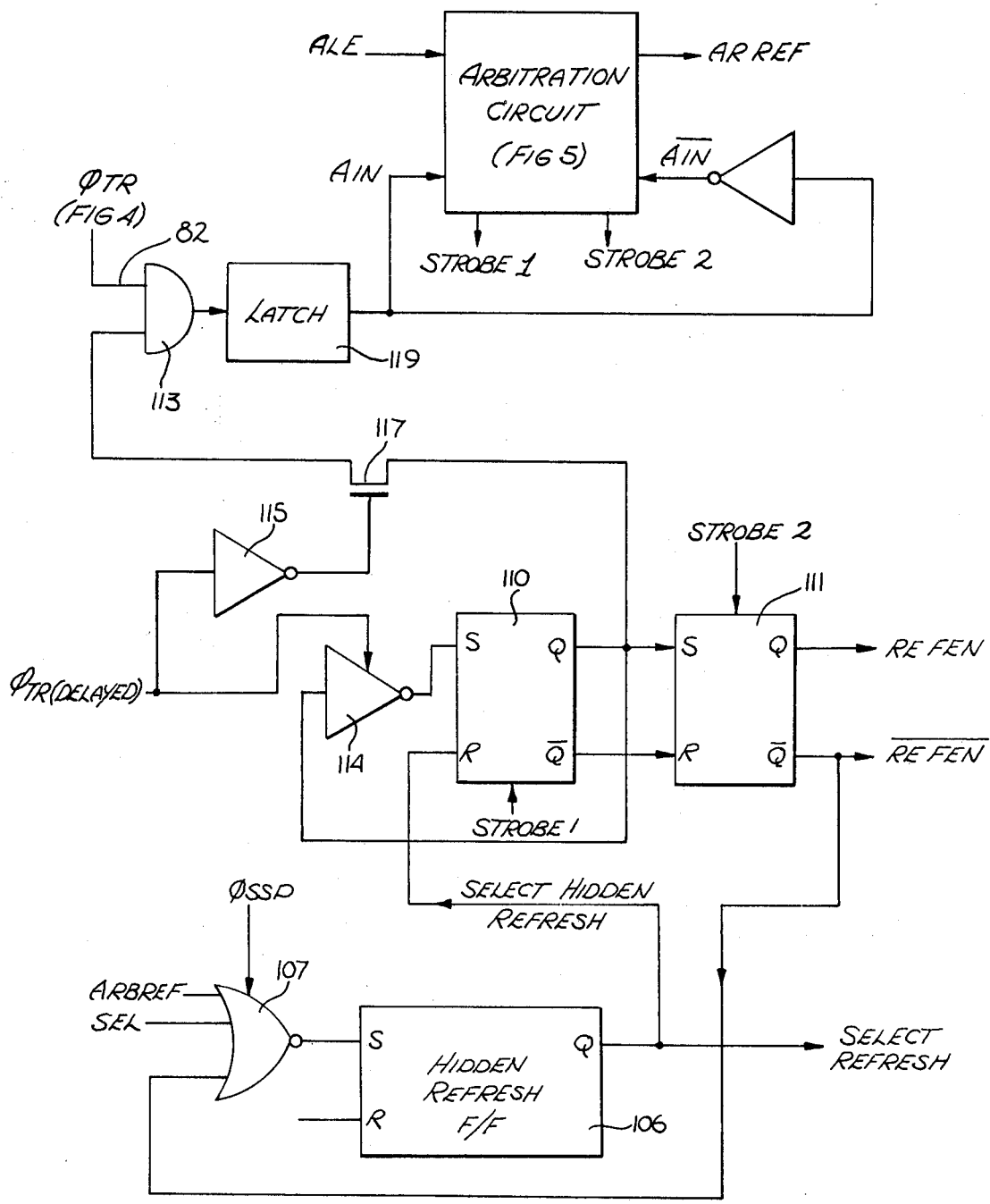
FIG. 6 is a block diagram of the circuitry used to provide the "hidden" refresh in the invented memory.
Figure 7:
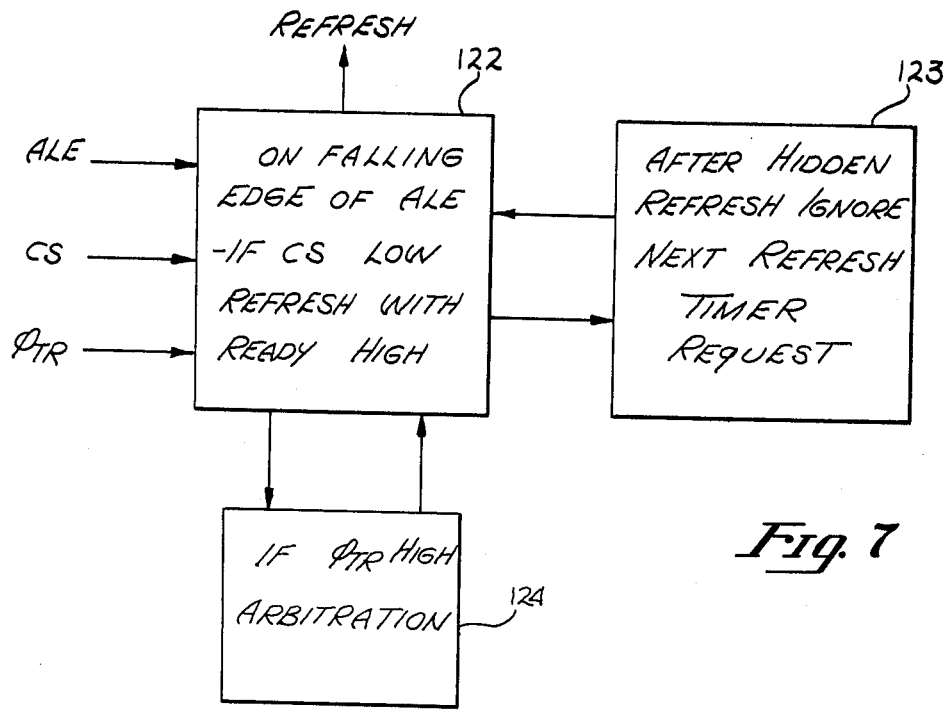
FIG. 7 is a series of blocks used to explain the operation of the circuitry of FIG. 6.

The hidden refresh feature illustrated by FIG. 7 may be implemented in numerous ways with ordinary logic circuits. The presently preferred implementation is indicated in a modified block diagram form in FIG. 6. The hidden refresh bistable circuit (flip-flop) 106 determines when a hidden refresh may occur. The Q output of this circuit causes a refresh. This occurs when the output of the NOR gate 107 is high; that is when all the inputs to this gate are low. These inputs are the arbitrated refresh signal, select signal, and $\overline{REFEN}$, all timed by signal $\phi_{SSD}$. The circuit 106 is reset with a signal identified as "$\overline{BUSY}$" which is essentially a precharge signal which occurs on the precharging of the bit lines.

The output of the circuit 106 resets the bistable circuit 110 on the falling edge of the strobe 1 signal. (The strobe 1 and strobe 2 signals are the signals generated from the circuit of FIG. 5). Circuit 110, with its $\overline{Q}$ terminal high, sets the bistable circuit 111, such that $\overline{REFEN}$ is low on the falling edge of strobe 2 (rising edge of $\overline{BUSY}$). The $\phi_{TR}$ signal (slightly delayed by circuit not shown) through inverter 115 prevents conduction of transistor 117. This $\phi_{TR}$ signal through inverter 114 sets Q high for circuit 110 if Q is low. With the Q output of circuit 110 high, the next $\phi_{TR}$ signal through AND gate 113 will be latched by latch 119 and coupled to the arbitration circuit. This happens unless another hidden refresh signal occurs (from circuit 106) resetting circuit 110, pulling Q low and thus blocking $\phi_{TR}$ from the latch 119 by way of AND gate 113. Thus, only one hidden refresh will be performed per time out of the $\phi_{TR}$ signal, minimizing power dissipation.

Thus, the circuit of FIG. 6, when the Q terminal of circuit 110 is low, prevents a $\phi_{TR}$ signal (line 82) from being coupled to the arbitration circuit. However, when this terminal is high, then the $\phi_{TR}$ signal will be coupled through the latch 119 to the arbitration circuit.

Redundant Cells (Word Lines)

In the presently preferred embodiment, a plurality of extra (redundant) word lines are used as a means of increasing production yields of the memories. These redundant rows 36 are shown in FIG. 1. The row selection means for selecting the redundant rows and for preventing the selection of a faulty row is shown in FIG. 9.

After fabrication of the memories, during probe testing, faulty cells are identified. Appropriate fuses on the memory are then blown to substitute a redundant word line (with its cells) for a word line with a faulty cell or cells.

During operation (assuming no redundancy is necessary) the row address signals $A_0$ and $A_1$ (and their complements) from bus 126 are coupled to the decoders 128a, 128b, 128c and 128d. These decoders select one of the lines 135a, 135b, 135c or 135d. The remaining row address signals, $A_2$ through $A_5$ from bus 127 are coupled to X-decoders, two groups of which are shown as decoders 130 and 131. These decoders select the normal (non-redundant) word lines within the array. This selection is done in conjunction with the signals $\phi_{X0}-\phi_{X3}$. In this manner, for each possible signal combination of the address $A_0-A_5$ (and their complements), a single word line is selected.

The lines 135a through 135d are coupled to redundant word line drivers 132a through 132d, respectively. The signals on these lines select a redundant word line directly provided the WLDS signal is high as will be seen. Note the redundant word line decoders 134 are not a direct part of the drivers as in the case of decoders 130 and 131.

The selection circuitry for the redundant word lines (four of which are shown in FIG. 9) includes four fuse-decoders 133a, 133b, 133c and 133d. Each of these decoders receive the address signals $A_0-A_5$ (and other signals) and through programming, provide the correct combination of signals $A_0-A_5$ and $\overline{A_0-A_5}$ to the redundant row decoders 134a, 134b, 134c and 134d. Fuses within the fuse-decoders 133 are blown such that when the address of a failed row is communicated to the decoders, one of the signals, $R_0-R_3$ at the output of the redundant decoders 134 rises in potential. The circuit employed for the fuse-decoders 133 is shown in detail in FIG. 8 and shall be described later.

The outputs $R_0-R_3$ from the decoders 134a through 134d are coupled to the decoders 128a through 128d, respectively, and also to a NOR gate 136. The output of this gate is coupled to decoders 130 and 131, and like decoders. When a signal appears on line 137, the normal decoders 130 and 131 are disabled. (This is indicated by the "D" terminal on the decoder). The line 137 is also coupled to the redundant word line drivers; these drivers are enabled when a signal appears on line 137. (This is indicated by the "E" terminal on the decoders). Line 137 is also coupled to each of the decoders 128a through 128d; when a signal appears on this line, the decoders are disabled. Ordinary circuit means such as switches may be employed to disable and enable the circuits.

Assume that the array has a faulty word line (or cell on this line) and that the proper fuses have been blown such that the signal $R_0$ is high when the address for the faulty word line appears. The $R_0$ signal applied to the NOR gate 136 causes the word line disable signal (WLDS) on line 137 to go high. This signal when applied to the normal X-decoders 130 and 131 disable all the X decoders. Thus, the faulty line will not be selected. Also, the signal on line 137 disables the normal decoders 128a through 128d. The $R_0$ signal is applied to the "E" terminal of decoder 128d. This signal overrides the disable signal applied to decoder 128d and causes an output signal from this decoder ($\phi_{X0}$). This signal activates one of the four redundant word drivers 132 and causes the selection of a redundant word line. (Note, the WLDS signal on line 137 is applied to the E terminal of the drivers). Thus, with the circuit of FIG. 9, any one of the redundant word lines may be selected, and simultaneously, the failed word line is de-selected.

The circuit of FIG. 9 is of importance because it allows the selection of the redundant word lines using the same word line clock signals. For example, the lines carrying the $\phi_X$ signal are used both for normal operation and during redundant operation. This saves a considerable number of lines and substrate area.

Figure 8:
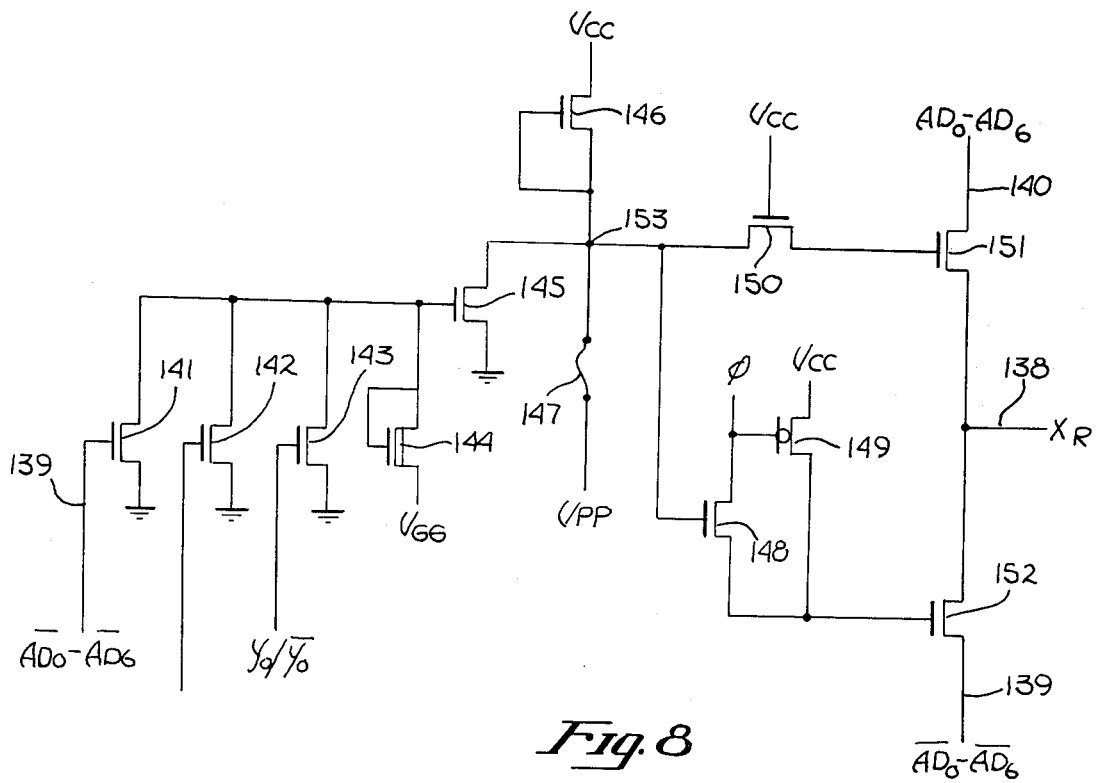
FIG. 8 is an electrical schematic of a novel buffer circuit used in the redundancy circuitry of the invented memory.

Referring to FIG. 8, each of fuse-decoders 133a–133b of FIG. 9 includes seven of the circuits shown in FIG. 8. Each of the transistors 141 receives a different one of the address signals $\overline{AD_0}$ through $\overline{AD_6}$ (line 139). These signals are also coupled to one terminal of the transistor 152. The address signals $AD_0$ through $AD_6$ are coupled through line 140 to one terminal of transistor 151. The common junction between these transistors, line 138, provides an output signal which is coupled to the redundant decoders 134. The transistor 142 receives either the $A_{12}$ or $\overline{A_{12}}$ signal and the transistor 143 receives the $Y_0/\overline{Y_0}$ signal. As will be explained, these signals are used to allow the selection of one of the four fuse-decoders 133a through 133d during programming.

The fuse 147, during programming, is coupled to a potential $V_{pp}$, otherwise this polysilicon fusible link is coupled to ground. (See U.S. Pat. No. 3,792,319 for a description of the fuse). During both programming and normal operation, the depletion mode transistor 146 is coupled between $V_{CC}$ and node 153. The circuitry to the right of node 153 is not used during programming, but during normal operation of the array. The circuitry to the left of node 153 is used for programming.

Assume first it is necessary to blow fuse 147. To do this, low signal levels are applied to the gates of transistors 141,142 and 143. A positive potential $V_{GG}$ applied to transistor 144 allows the gate of transistor 145 to rise in potential, causing transistor 145 to conduct. A positive potential $V_{pp}$ is applied to fuse 147 during programming. ($V_{GG}$ and $V_{pp}$ are at ground potential during normal (non-programming) operation). Current then flows through the fuse 147 and transistor 145, blowing the fuse 147. If the fuse is to remain intact, then transistor 141 is caused to conduct, preventing transistor 145 from conducting. This, in turn, prevents sufficient current flow through fuse 147 to blow the fuse. As mentioned, the signals applied to transistors 142 and 143 allow the selection of one of the four decoders 143a through 143d. (Note that during normal operation of the memory, the signals applied to these transistors serve other functions within the memory and the programming circuitry used for blowing fuse 147 is not used).

Assume first that the circuit of FIG. 8 is to be programmed such that the output line 138 follows the signal on line 140, that is, the true address. For this case, the fuse is blown. In the operation of the circuit, with the fuse blown, node 153 is pulled to $V_{CC}$ through transistor 146. Since transistor 150 is conducting, the potential on line 153 is transferred to the gate of transistor 151, thus this transistor conducts. For this dynamic circuit, initially $\phi$ is high and then drops in potential when a signal is to be sensed on line 138. ($\phi$ is one of the timing signals used in the memory). This signal causes transistor 149 to conduct, and this conduction turns on transistor 152. When $\phi$ drops in potential, transistor 149 ceases to conduct and the gate of transistor 152 is coupled to ground (through the $\phi$ line) since transistor 148 is on. Thus, only transistor 151 conducts and line 138 follows line 140 or the true addresses.

On the other hand, if a fuse is not blown, node 153 is at ground potential. ($V_{pp}$ is at ground potential for normal operation). The ground potential at node 153 is coupled through transistor 150 to the gate of transistor 151 and thus, this transistor does not conduct. When $\phi$ is high, transistor 149 conducts and so does transistor 152. When $\phi$ drops in potential, the charge on the gate 152 remains since transistor 148 is not conducting. Thus, transistor 152 continues to conduct and line 138 follows line 139 or the complement of the true address.

The circuit of FIG. 8 has the advantage that during normal operation, the fuses are used to pull line 153 to ground potential. This is important in laying out the circuit and provides advantages for the polysilicon fuses used in the presently preferred embodiment.

Thus, a dynamic MOS random-access memory has been described which has numerous advantages over prior art memories, including (1) a circuit for readily checking the refresh counter (2) a refresh generator with variable frequency rate to compensate for temperature variations, (3) an arbitration circuit to resolve conflicting signals, particularly signals used to access the memory and self refresh signals, (4) hidden refresh function, and (5) a unique redundancy scheme.

We claim:

1. In a metal-oxide-semiconductor (MOS) dynamic memory formed on a substrate requiring refreshing which includes an oscillator formed on said substrate and which does not require substantial substrate area for controlling the frequency of refreshing, an improvement in said oscillator comprising:

a capacitor;

a resistor, the resistance of which varies as a function of temperature;

multiplication means interconnecting said resistor and said capacitor for increasing the effective resistance of said resistor as seen by said capacitor;

said effective resistance and the capacitance of said capacitor having an effective time constant which substantially determines the frequency of said oscillator;

whereby said frequency of refreshing is made dependent on temperature.

2. The improvement defined by claim 1 wherein said resistor is formed from polysilicon and has a positive temperature coefficient.

3. The improvement defined by claim 2 wherein said multiplication means comprises a first and a second field-effect transistor having slightly positive threshold voltages, one terminal of each of said transistors being coupled to said resistor, the other terminal of said first transistor being coupled to a source of potential, the gates of said transistors and the other terminal of said second transistor being coupled to said capacitor.

4. The improvement defined by claim 3 wherein said transistors are maintained in saturation.

* * * * *